United States Patent
Burkhardt

(10) Patent No.: US 6,603,663 B2
(45) Date of Patent: Aug. 5, 2003

(54) ELECTRONIC UNIT

(75) Inventor: Matthias Burkhardt, München (DE)

(73) Assignee: Patent-Treuhand-Gesellscahft fuer Elektrische Gluehlampen mbH, Munich (DE)

( * ) Notice: Subject to any disclaimer, the term of this patent is extended or adjusted under 35 U.S.C. 154(b) by 0 days.

(21) Appl. No.: 09/960,312

(22) Filed: Sep. 24, 2001

(65) Prior Publication Data
US 2002/0057555 A1 May 16, 2002

(30) Foreign Application Priority Data
Sep. 26, 2000 (DE) ...................... 100 457 897

(51) Int. Cl.⁷ ................................ H05K 1/14
(52) U.S. Cl. ................. 361/736; 361/760; 361/743; 361/794; 361/751
(58) Field of Search ................. 361/736, 760, 361/807, 794, 762, 778, 743, 745, 751, 752, 730

(56) References Cited
U.S. PATENT DOCUMENTS 5,400,221 A * 3/1995 Kawaguchi ............... 174/257
5,432,357 A * 7/1995 Kato et al. ................ 257/76
5,535,101 A * 7/1996 Miles et al. .............. 174/260
6,068,180 A   5/2000 Test
6,079,987 A * 6/2000 Matsunaga et al. .......... 439/66

FOREIGN PATENT DOCUMENTS

DE    94 11 360    7/1994
DE   195 08 902    3/1995

* cited by examiner

Primary Examiner—David Martin
Assistant Examiner—Hung Bui
(74) Attorney, Agent, or Firm—Carlo S. Bessone

(57) ABSTRACT

The invention relates to an electronic unit having a mounting board (4) and electronic components (1–3) mounted on it, with the mounting board (4) having metal webs (41) which are embedded in an electrically insulating material (40), the metal webs (41) having a first side (411), which is in the form of a contact surface for making contact with the electronic components (1–3) and having a second side (412) facing away from this. According to the invention, cutout(s) are arranged in the electrically insulating material (40), via which the second side (412) of each metal web (41) is accessible for a voltage or current measurement apparatus.

4 Claims, 1 Drawing Sheet

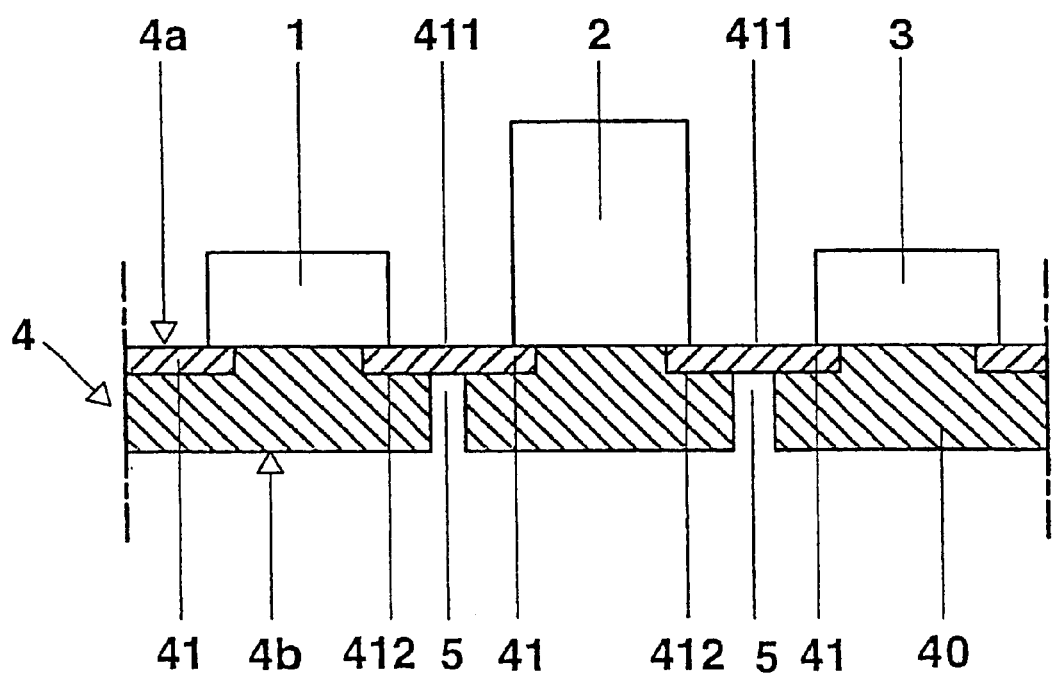

ELECTRONIC UNIT

The invention relates to an electronic unit as claimed in the precharacterizing clause of patent claim 1.

I. PRIOR ART

An electronic unit such as this is disclosed, for example, in U.S. Pat. No. 6,068,180. This patent specification describes how contact is made between a semiconductor component and a mounting board, which has conductor tracks embedded in plastic. The ends of the conductor tracks are equipped with contact surfaces for making contact with the connections of the semiconductor component. One disadvantage of this arrangement is that, in order to check the functioning of the electronic unit by means of a current or voltage measurement apparatus, either the same contact surfaces which were previously used to make contact with the semiconductor component must be used to make contact with the current or voltage sensors of the measurement apparatus, or else additional contact surfaces must be provided on the mounting board, which are provided exclusively for making contact with the current or voltage sensors of the measurement apparatus.

II. DESCRIPTION OF THE INVENTION

The object of the invention is to provide an electronic unit of this generic type in which the capability to connect the current or voltage sensors of a measurement apparatus is improved.

According to the invention, this subject is achieved by the characterizing features of patent claim 1.

Particularly advantageous embodiments of the invention are described in the dependent claims.

The electronic components of the electronic unit according to the invention are arranged on a mounting board, which has metal webs embedded in an electrically insulating material. The metal webs, which are normally used as conductor tracks between the electronic components, have a first side which is in the form of a contact surface for making contact with the electronic components, and a second side facing away from it. According to the invention, cutouts are arranged in the electrically insulating material, via which the second side of each metal web is accessible for a voltage or current measurement apparatus. The second side of the metal webs, which are connected to the electronic components to be tested by a measurement apparatus, is used as a contact surface for the current or voltage sensors of the measurement apparatus. It is thus possible to use the same metal webs which were used to make contact with the electronic components to make contact with the current or voltage sensors of the measurement apparatus as well without, in the process, having to subject the contacts of the electronic components to the risk of damage. Furthermore, no additional contact surfaces need be provided on the mounting plate for the current or voltage sensors of the measurement apparatus, either.

The electronic unit according to the invention is advantageously designed such that the mounting board has a top face from which the first side, which is in the form of a contact surface, of the metal webs is accessible and on which the electronic components are arranged, and has a lower face, which faces away from the top face and is provided with the cutouts. The current or voltage sensors of the measurement apparatus thus produce the contact, via the lower face of the mounting board, with the electronic components which are to be tested and are mounted on the top face, preferably using SMD technology (SMD is an abbreviation for Surface Mounted Device). In consequence, the design of the current or voltage sensors of the measurement apparatus need not take any account of the physical height of the electronic components.

III. DESCRIPTION OF THE PREFERRED EXEMPLARY EMBODIMENT

The invention will be explained in more detail in the following text with reference to a preferred exemplary embodiment. The FIGURE shows a detail of an electronic unit according to one preferred exemplary embodiment of the invention, in the form of a cross section and a schematic illustration. The electronic unit has a large number of SMD components 1–3, which are mounted on a first side 4a, referred to as a top face 4a in the following text, of a mounting board 4 in the form of a lead frame. The mounting board 4 is composed of an electrically insulating material 40, in which metal webs 41 are embedded. The metal webs 41 are used as electrical conductor tracks between the SMD components 1–3 and to make contact between the SMD components 1–3 and the mounting board 4. In order to make contact with the SMD components 1–3, the metal webs 41 have first sides 411 in the form of contact surfaces, which face the top face 4a of the mounting board 4. The mounting board 4 is provided with a number of cutouts 5 in the plastic 40, which extend from the second side 4b, which faces away from the top face 4a of the mounting board 4 and is referred to as the lower face 4b in the following text, to those metal webs 41 which are connected to the SMD components 2 to be tested. The second side 412, which faces away from the top face 4a and from the contact surface 411, of the metal webs 41 is accessible for the current or voltage sensors of a measurement apparatus (not shown) via the cutouts 5. The second sides 412 of the metal webs 41, which make contact with the SMD component 2, are used as contact surfaces for the current or voltage sensors of the measurement apparatus. The functionality of individual SMD components or of a group of SMD components, and/or of the entire electronic unit, is thus checked by means of the measurement apparatus via the lower face 4b of the mounting board 4. The current or voltage sensor (not shown), which is in the form of a plug or adapter, of the measurement apparatus has contact pins, the number and dimensions of which are matched to those of the cutouts 5 in the mounting board 4. In contrast, contact is made between the SMD components 1–3 in the electronic unit for example by soldering using the reflow method, exclusively on the top face 4a of the mounting board 4, so that the solder points of the SMD components 1–3 cannot be damaged by the test procedure by means of the measurement apparatus. The electronic unit is the starting apparatus and a full-bridge inverter for operation of a high-pressure discharge lamp.

What is claimed is:

1. An electronic unit having a mounting board (4) and electronic components (1–3) mounted on it, with the mounting board (4) having metal webs (41) which are embedded in an electrically insulating material (40), the metal webs (41) having a first side (411), which is in the form of a contact surface for making contact with the electronic components (1–3) and having a second side (412) facing away from it, characterized in that cutouts (5) are arranged in the electrically insulating material (40), via which the second side (412) of each metal web (41) is accessible for a voltage or current measurement apparatus.

2. The electronic unit as claimed in claim 1, characterized in that the mounting board (4) has a top face (4a) from which the first side (411), which is in the form of a contact surface, of the metal webs (41) is accessible and on which the electronic components (1–3) are arranged, and has a lower face (4b), which faces away from the top face (4a) and is provided with the cutouts (5).

3. The electronic unit as claimed in claim 1, characterized in that the electronic components (1–3) are SMD components.

4. The electronic unit as claimed in claim 2, characterized in that the electronic components (1–3) are SMD components.

* * * * *